(12) United States Patent
Guedon et al.

(10) Patent No.: US 6,864,736 B2
(45) Date of Patent: Mar. 8, 2005

(54) HIGH-VOLTAGE INVERTER AMPLIFIER DEVICE

(75) Inventors: Yannick Guedon, Sassenage (FR); Philippe Maige, Seyssinet-Pariset (FR)

(73) Assignee: STMicroelectronics S.A. (FR)

( * ) Notice: Subject to any disclaimer, the term of this patent is extended or adjusted under 35 U.S.C. 154(b) by 0 days.

(21) Appl. No.: 10/446,508

(22) Filed: May 27, 2003

(65) Prior Publication Data

US 2004/0012411 A1 Jan. 22, 2004

(30) Foreign Application Priority Data

May 28, 2002 (FR) .......................................... 02 06517

(51) Int. Cl.[7] .............................................. H03L 5/00
(52) U.S. Cl. .......................... 327/333; 326/80; 326/81
(58) Field of Search ................................ 327/333, 108, 327/110, 112; 326/80, 81, 62, 63, 68

(56) References Cited

U.S. PATENT DOCUMENTS

| | | | |
|---|---|---|---|
| 5,394,374 A | 2/1995 | Ishimura et al. | 365/230.06 |
| 5,565,806 A | * 10/1996 | Cordini et al. | 327/108 |
| 5,587,676 A | * 12/1996 | Chowdhury | 327/108 |
| 6,057,726 A | * 5/2000 | Sumida | 327/333 |

FOREIGN PATENT DOCUMENTS

| | | |
|---|---|---|
| DE | 198 14 675 A1 | 10/1998 |
| EP | 0 913 925 A1 | 5/1999 |
| EP | 0 913 927 A1 | 5/1999 |

OTHER PUBLICATIONS

Mori, et al., "A 5 to 130v Level Shifter Composed of Thin Gate Oxide Dual Terminal Drain PMOSFETS", *IEEE International Symposium on Power Semiconductor Devices and ICS*, pp. 345–348, May 26–29, 1997.
French Search Report, FA 619038/FR 0206517, dated Feb. 18, 2003.

* cited by examiner

*Primary Examiner*—Tuan T. Lam
(74) *Attorney, Agent, or Firm*—Jenkens & Gilchrist, PC

(57) ABSTRACT

An intermediate stage of a high-voltage inverting amplifier includes a drive transistor (MB5) of the thin-gate-oxide high-voltage MOS type connected between a supply terminal and the gate of an output transistor (M28). At least one first diode (DB) is included in the intermediate stage, wherein the cathode of that diode is connected to the gate of the drive transistor and the anode is connected to a level transposition stage of the amplifier. A control circuit is connected to the gate of the drive transistor so as to enable it to conduct when an initially zero supply voltage reaches the threshold voltage of the drive transistor. This causes the output transistor to conduct more quickly with increased supply voltage than would be experienced with prior art designs.

36 Claims, 5 Drawing Sheets

HIGH-VOLTAGE INVERTER AMPLIFIER DEVICE

BACKGROUND OF THE INVENTION

1. Technical Field of the Invention

The present invention relates to high-voltage inverter amplifier devices (or buffers), in particular those produced in the form of integrated circuits. The invention applies advantageously, but not exclusively, to plasma display panel (PDP) drivers.

2. Description of Related Art

A high-voltage inverter amplifier device receives as input a low-voltage logic signal (a logic signal whose low state is at 0 V for example and whose high state may typically be at about 3 V to 5 V) and delivers as output a high-voltage logic signal (the high state of which may be typically at about 50 V to 80 V).

Such a high-voltage amplifier device may operate in two different modes, namely a "direct current" mode (DC mode) and an "alternating current" mode (AC mode).

In DC mode, the supply voltage is fixed and equal to the voltage of the high-voltage logic. The change in state of the output of the amplifier device is therefore controlled by the change in state of the input signal.

In AC mode, the input signal is capable of adopting one of the two states of the low-voltage logic (low state at 0 V for example and high state at a voltage of 5 V, for example). The supply voltage then rises, for example from 0 V to 60 V in 200 nanoseconds and then stabilizes at this high voltage, for example for 400 nanoseconds, and then comes back down to 0 V. If the input signal is in the low state, the output voltage (output signal) must pass to the high state and it is therefore supposed to follow the supply voltage. If the input signal is at the high state, the output voltage remains in the low state.

A high-voltage inverter amplifier device of the prior art is shown schematically in FIG. 1. This device comprises vertical double-diffused MOS transistors (VDMOS transistors) capable of taking a high voltage between their source and their drain, for example 80 V, and having a low threshold voltage, typically of about 1.5 V, and transistors called 80VPCHFOX transistors, which are thick-gate-oxide high-voltage p-channel MOS transistors. These transistors have the advantage of being able to tolerate the entire supply voltage, for example up to 80 V, both between source and drain and on their gate, thereby allowing a level transposition to be made (low-voltage input logic transposed into high-voltage logic on the nodes A, B, C). However, these transistors have the disadvantage of possessing a high threshold voltage, typically of the order of 10 V.

As illustrated in FIG. 1, the device includes a level transposition cell connected to the input terminal IN and formed from the transistors M0, M2, M1 and M3. The device also includes an output stage comprising an 80VDMOS-type n-channel output transistor M28 equipped with a Zener diode Z1 anti-parallel connected between its source and its gate. The output stage also includes another transistor M6, also of the n-channel 80VDMOS type, connected between the source of the transistor M28 and a high-voltage earth/ground terminal VSSP. The common node between the transistors M6 and M28 forms the output terminal OUT of the device.

The inverter amplifier device also includes an intermediate stage, serving to drive the output stage, and composed here of an 80VPCHFOX-type p-channel transistor M5 and an 80VDMOS-type n-channel transistor M4. The gate of the transistor M5 is connected to the node B of the level transposition stage and the drain of the transistor M5 is connected to the drain of the transistor M4 and to the gate of the output transistor M28.

Let us now assume that the input voltage is in the low state in order to ensure a high logic level as output in AC mode. When the supply voltage VPP increases, the transistors M1, M3 and M5 can conduct only when the supply voltage VPP exceeds 10 V. Below this threshold, the voltage at the node C cannot rise and the output voltage cannot follow the supply voltage VPP. In other words, the output transistor M28 cannot conduct while the transistor M5 is not conducting.

When the transistor M5 starts to conduct, the voltage at the node C starts to rise and the output voltage then follows the supply voltage with a voltage shift equal to the threshold voltage of the transistor M5. The transistor M28 is fully conducting when its drain/source voltage difference has reached the threshold voltage of the transistor M5 increased by the Zener voltage of the diode Z1, which corresponds to an overall value of about 15 V. In other words, when the transistor M28 starts to conduct, it has a voltage on its terminals equal to 11.5 volts (threshold voltage of the transistor M5+threshold voltage of the transistor M28) and then equal to the full-conduction voltage shift of 15 V. Thus, the transistor M28 conducts the current with a high drain/source voltage difference. As a consequence, there is considerable power dissipation in the transistor M28, which is detrimental.

The present invention aims to provide a solution to this problem and other problems recognized by those skilled in the art.

SUMMARY OF THE INVENTION

The invention therefore provides a high-voltage inverter amplifier device possessing an input for receiving a low-voltage logic signal, an output for delivering a high-voltage logic signal, a level transposition stage connected to the input, an output stage comprising an output transistor connected between a high-voltage supply terminal and the output, and an intermediate stage intended to drive the output stage and connected between the supply terminal, the level transposition stage and the gate of the output transistor.

According to a general feature of the invention, the intermediate stage comprises a drive transistor of the thin-gate-oxide high-voltage MOS type connected between the supply terminal and the gate of the output transistor. The intermediate stage furthermore comprises at least one first diode, the cathode of which is connected to the gate of the drive transistor and the anode of which is connected to the level transposition stage, and control means connected to the gate of the drive transistor so as to make it conduct when the initially zero supply voltage reaches the threshold voltage of the drive transistor.

The drive transistor, for example of the 80VPCH type, may take the high voltage (up to 80 V) between drain and source but on the other hand must never see more than 5 to 10 V on its gate. In contrast, it has a low threshold voltage, typically of about 1.5 V.

Thus, as soon as this drive transistor conducts, that is to say when the supply voltage has reached the threshold voltage, the output transistor conducts, and does so with a low drain/source voltage, typically about 1.5 V. Consequently, as soon as the output transistor starts to conduct, the power dissipation therein is substantially less than that occurring in the prior art.

One of the functions of the first diode is to keep the drive transistor off in DC mode.

According to one embodiment of the invention, the drive transistor is a p-channel transistor and the control means then advantageously comprise a Zener diode, the cathode of which is connected to the supply terminal and the anode of which is connected to the gate of the drive transistor, and a capacitor connected between the gate of the drive transistor and earth/ground.

The capacitance of the capacitor is chosen so as to keep the gate of the drive transistor at earth/ground by means of a capacitive divider with the anode-cathode capacitance of the Zener diode and the transition capacitance of the first diode.

The intermediate stage may also include, although this is not essential, a second diode, the cathode of which is connected to the gate of the drive transistor and the anode of which is connected to the gate of the output transistor. This second diode allows the drive transistor to stop conducting when the voltage at the drain of the drive transistor is high enough.

According to one embodiment of the invention, the intermediate stage includes an additional transistor, which is a thick-gate-oxide high-voltage MOS transistor, for example of the 80VPCHFOX type, connected between the gate of the output transistor and the level transposition stage. Furthermore, the substrate of this additional transistor is connected to the gate of the drive transistor, and it is controlled on its gate so as to be always off, this additional transistor forming the first and second diodes and the capacitor of the control means. In other words, a single component, namely this additional transistor, allows the two diodes and the capacitor to be integrated. When this additional transistor is a p-channel transistor, care is taken to connect its gate to the supply voltage so that it is never conducting. The bulk/substrate capacitance of this thick oxide transistor acts as the capacitor of the control means.

Although in an alternative embodiment the intermediate stage may include only the abovementioned drive transistor of the thin-gate-oxide high-voltage type, offering the advantage of making the device more compact, it may prove preferable, in some applications, for the intermediate stage to also include a pair of complementary intermediate transistors, the p-channel intermediate transistor of which is a thick-gate-oxide high-voltage MOS transistor. This p-channel intermediate transistor has its source connected to the supply terminal and its drain connected to the gate of the output transistor and also to the drain of the drive transistor. The gate of the p-channel intermediate transistor is connected to the level transposition stage.

When the two diodes and the capacitor of the control means are produced by the additional transistor of the thick-gate-oxide high-voltage MOS type, the source of this additional transistor is also connected to the drain of the p-channel intermediate transistor.

The device according to the invention is advantageously produced in the form of an integrated circuit.

The subject of the invention is also a plasma panel incorporating at least one amplifier device as defined above.

BRIEF DESCRIPTION OF THE DRAWINGS

A more complete understanding of the method and apparatus of the present invention may be acquired by reference to the following Detailed Description when taken in conjunction with the accompanying Drawings wherein.

DETAILED DESCRIPTION OF THE DRAWINGS

Figure 1:
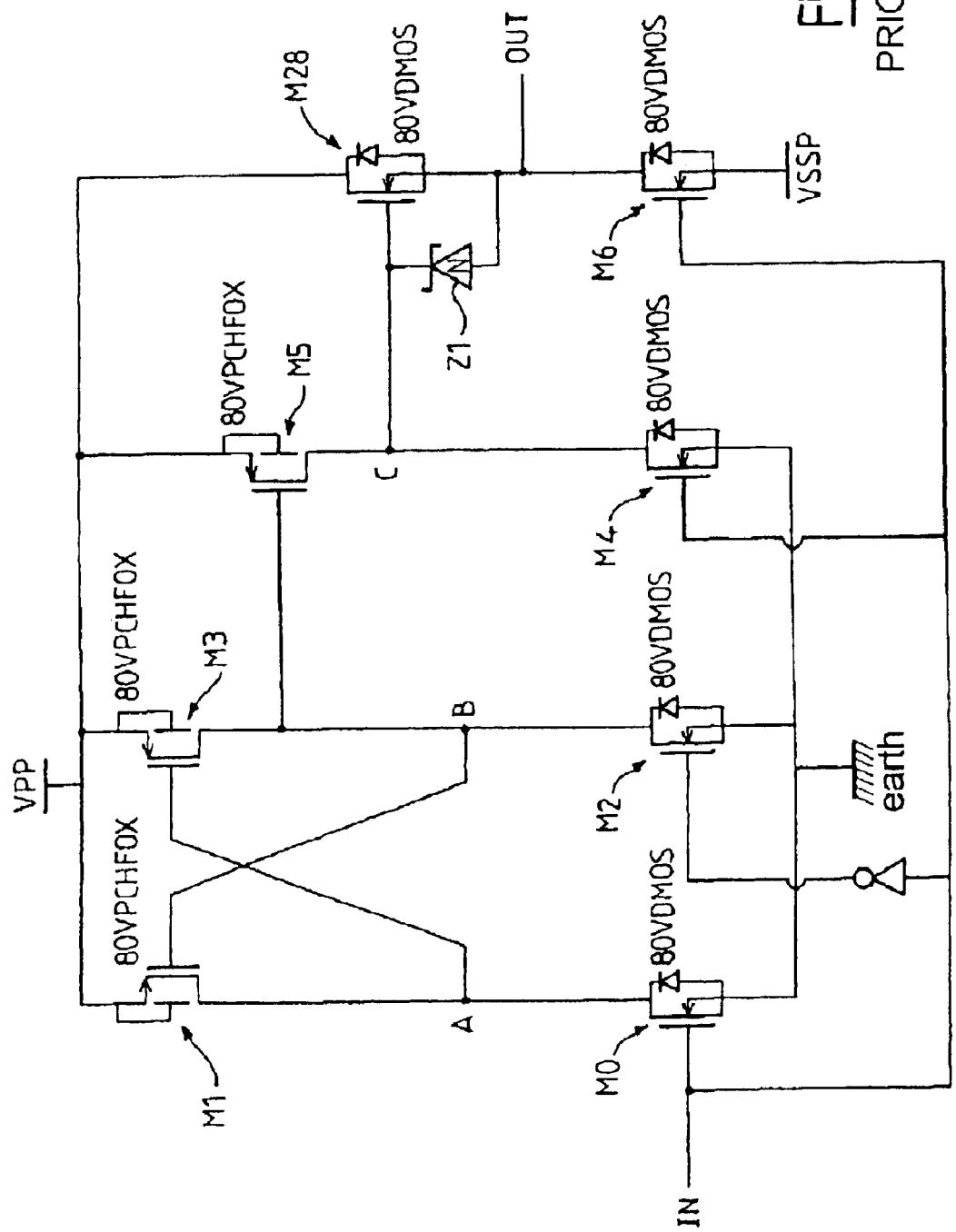
FIG. 1, already described, illustrates schematically an amplifier device according to the prior art.
Figure 2:
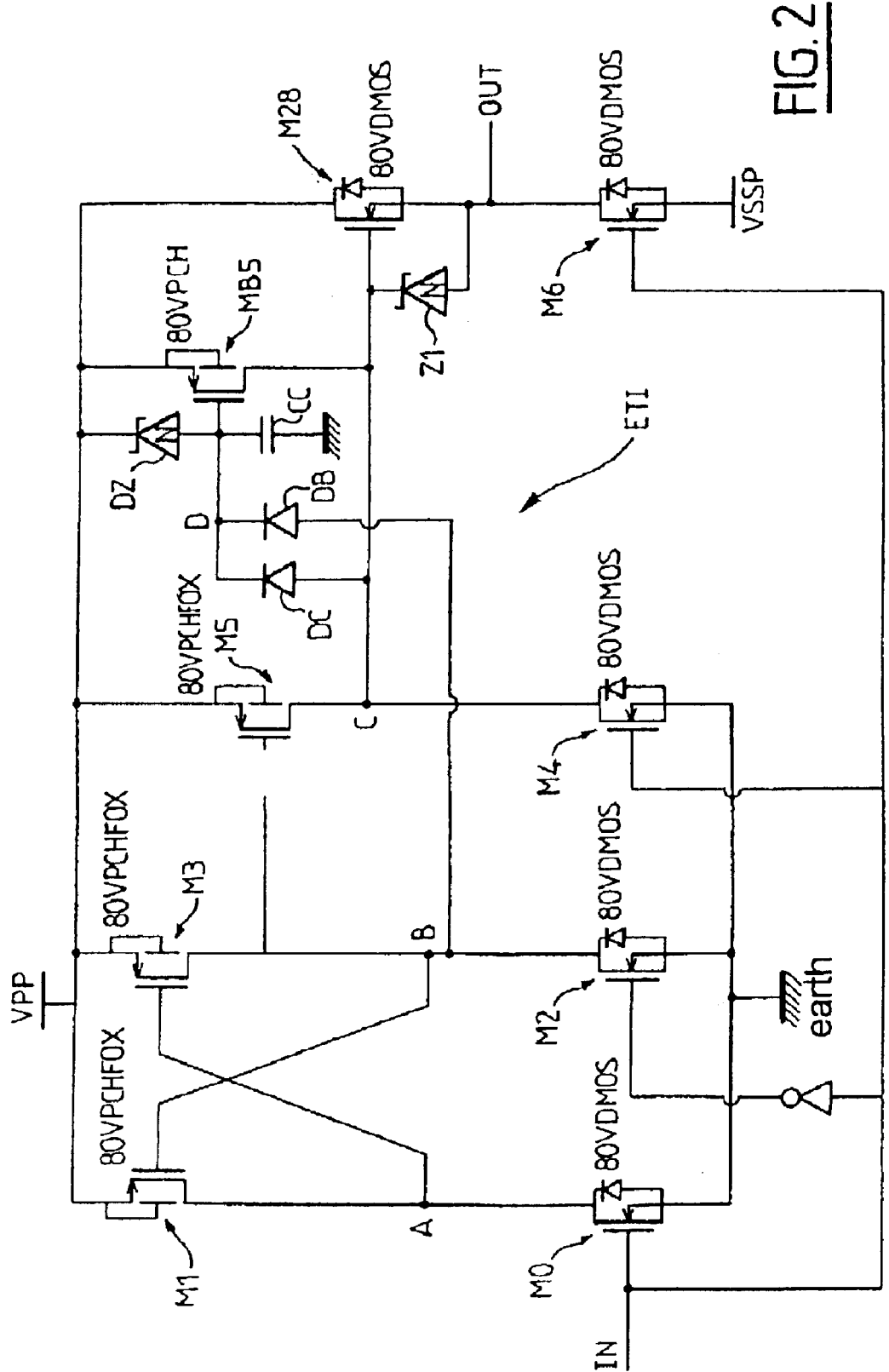
FIG. 2 illustrates schematically a first embodiment of an amplifier device according to the invention.

Compared with the device of the prior art illustrated in FIG. 1, it may be seen that the intermediate stage ETI of the device according to the invention, in its embodiment illustrated in FIG. 2, comprises, apart from the two complementary intermediate transistors M5 and M4, a drive transistor MB5 of the thin-gate-oxide high-voltage MOS type. In the example illustrated, the transistor MB5 is an 80VPCH-type transistor, that is to say a vertical p-channel transistor capable of withstanding 80 V between source and drain. On the other hand, since the gate oxide of this transistor is a thin oxide, typically an oxide of less than or equal to a few tens of nanometers, the threshold voltage of this transistor MB5 is low, typically around 1.5 V, and, furthermore, its gate voltage must not exceed a certain value, typically around 5 to 10 V. Compared with a thin-gate-oxide transistor, the gate oxide of a thick-gate-oxide transistor is, for example, approximately 100 times thicker.

The source of this drive transistor MB5 is connected to the supply voltage VPP and its drain is connected, on one side, to the node C of the intermediate stage ETI and, on the other side, to the gate of the output transistor M28.

The gate of this drive transistor MB5 is connected, on one side, to the supply voltage VPP via a Zener diode DZ and, on the other side, to earth/ground via a capacitor CC.

The intermediate stage ETI also includes a first diode DB, the cathode of which, forming the node D of this intermediate stage ETI, is connected to the gate of the drive transistor MB5 and the anode of which is connected to the node B of the level transposition stage.

The intermediate stage ETI also includes a second diode DC, the cathode of which is connected to the node D and the anode of which is connected to the node C, and consequently to the drain of the drive transistor MB5 and to the gate of the output transistor M28.

The operation of the device in FIG. 2 will now be described in greater detail.

Let us suppose that the input voltage, present at the input IN, is in the low state so as to ensure a high logic level at the output OUT of the device in AC mode.

When the supply voltage VPP increases, but has not reached 1.5 V, that is to say the threshold voltage of the drive transistor MB5, the transistor MB5 is off since the gate/source voltage difference is below the threshold voltage.

However, when the supply voltage VPP reaches 1.5 V, the drive transistor MB5 can conduct since its gate/source voltage difference is above its threshold voltage. In fact, the voltage of the node D remains close to earth/ground since the capacitance of the capacitor CC was chosen to be large compared with the junction capacitance of the Zener diode, and in any case sufficient to maintain this node D at earth/ground by means of a capacitive divider with the anode-cathode capacitance of the Zener diode DZ and the transition capacitances of the diodes DB and DC.

The voltage at the node C can then increase, although the intermediate transistor M5 is not yet conducting. Consequently, the output transistor M28 can start to conduct the current, and to do so at a low drain/source voltage (that is to say 3 volts, then 6.5 volts when fully conducting), which greatly reduces its energy dissipation.

When the supply voltage VPP continues to rise, the drive transistor MB5 conducts greater and greater currents and the voltage at the node C increases.

When the supply voltage VPP reaches 5 V, corresponding to the value of the Zener voltage, the voltage at the node D continues to rise and follows the supply voltage VPP with a 5 V shift. The drive transistor MB5 then conducts the current with a gate/source voltage difference equal to the Zener voltage of 5 V.

When the supply voltage VPP has reached its final value, for example 60 V, the voltage at the node D remains at 5 V below this supply voltage. It is then particularly advantageous, although this is not absolutely necessary, to be able to stop the transistor MB5 from conducting when the voltage at the node C is high enough. This is the role of the diode DC.

This is because, in general, the drive transistor MB5 will be off when its gate/source voltage difference, that is to say the voltage difference between the supply voltage VPP and the voltage at the node D, is below the threshold voltage. However, the voltage at the node D is equal to the voltage at the node C less the threshold voltage of the diode DC, that is to say 0.7 V. Consequently, the drive transistor MB5 will be off when the voltage difference between the supply voltage VPP and the voltage at the node C is below the threshold voltage of the transistor M5 less the threshold voltage of the diode, that is to say when this voltage difference VPP–V(C) is less than 0.7 V.

The diode DC therefore operates as a component for returning the node D to the high state.

Let us now assume that the input voltage is in the high state so as to ensure a low logic level as output in AC mode.

When the supply voltage VPP increases, the drive transistor MB5 will start to conduct as indicated above. However, if the input voltage is in the high state, the n-channel intermediate transistor M4 is conducting, so as to ensure a low level on the node C and at the output OUT. Consequently, if the transistor MB5 conducts the current, there will be energy dissipation across the MB5, M4 path. To eliminate this energy dissipation, the drive transistor MB5 is turned off by the diode DB, which operates in a manner similar to that described above in the case of the diode DC, turning the transistor MB5 off as soon as the voltage difference between the supply voltage VPP and the voltage at the node B is less than 0.7 V.

Moreover, in DC mode, the drive transistor MB5 is always off since the gate/source voltage difference remains below the threshold voltage, and is so permanently because of the presence of the diode DB or the diode DC.

Thus, a person skilled in the art will have noticed that the drive transistor MB5 conducts the current only when it is necessary, namely when the output voltage must rise and follow the supply voltage in AC mode.

The device according to the invention makes it possible to achieve a substantial saving in instantaneous dissipated power and consequently an energy saving. By way of indication, with an output load capacitance of 50 picofarads and a rise in the supply voltage from 0 to 60 V in 20 ns, a device of the prior art would have an energy of 22 nC on the rising edge of the supply voltage and an energy of 5.4 nC on the falling edge.

In contrast, with the device according to the invention, an energy on the rising edge of 11.5 nC is then obtained, while the energy on the falling edge remains the same.

The energy saving is therefore around 50%.

If we now consider a plasma panel comprising 192 devices according to the invention, with 400-line addressing over eight subfields, the equivalent frequency F to be considered for the power calculation is 400×8×60 Hz, i.e. 193 kHz.

The dissipated power is then equal to E×F×number of outputs, where E is the total dissipated energy on the rising edge and on the falling edge of the supply voltage.

Thus, for a plasma panel equipped with the device according to the prior art, the total dissipated power is around 1 watt, whereas it is 630 milliwatts for a plasma panel equipped with 192 devices according to the invention. The power saving is therefore significant.

Figure 3:
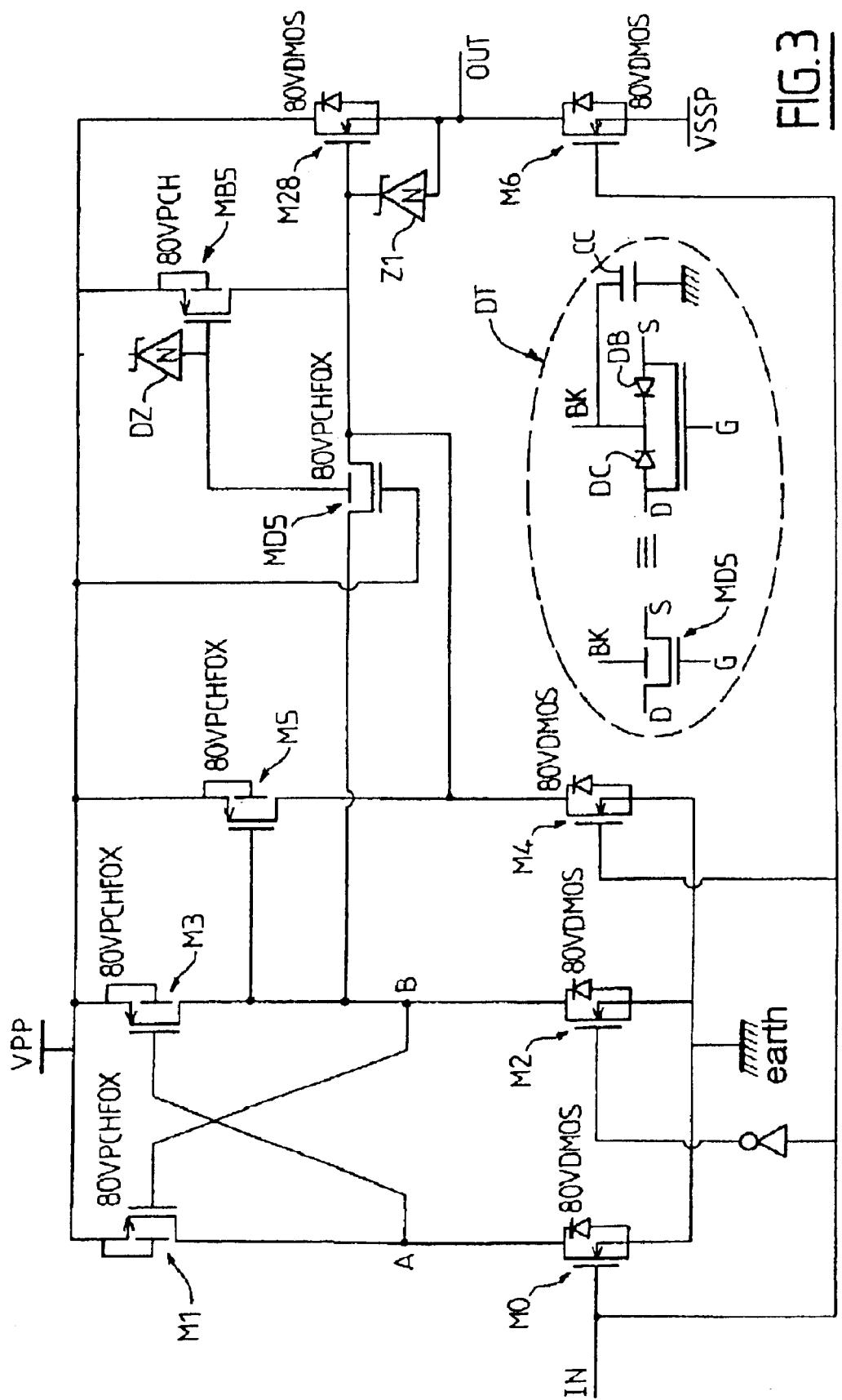
FIG. 3 illustrates another embodiment of a device according to the invention.

A single component, namely an additional transistor MD5 (FIG. 3) advantageously allows the two diodes DB and DC and the capacitor CC to be integrated, as illustrated in FIG. 3. More specifically, the bulk BK of this additional transistor MD5 of the thick-gate-oxide high-voltage type (for example of the 80VPCHFOX type) is connected to the gate of the transistor MD5, while the source of the transistor MD5 is connected to the node B, its drain being connected to the node C.

The gate of the additional transistor MD5 is connected to the supply voltage VPP in such a way that this transistor MD5 is always off.

As illustrated in the detail DT of this FIG. 3, the diode DB is formed between the bulk BK and the source of the transistor MD5, while the diode DC is formed between the bulk BK and the drain of its transistor MD5. Moreover, the bulk BK/substrate capacitance of the integrated circuit acts as the capacitor CC.

Figure 4:
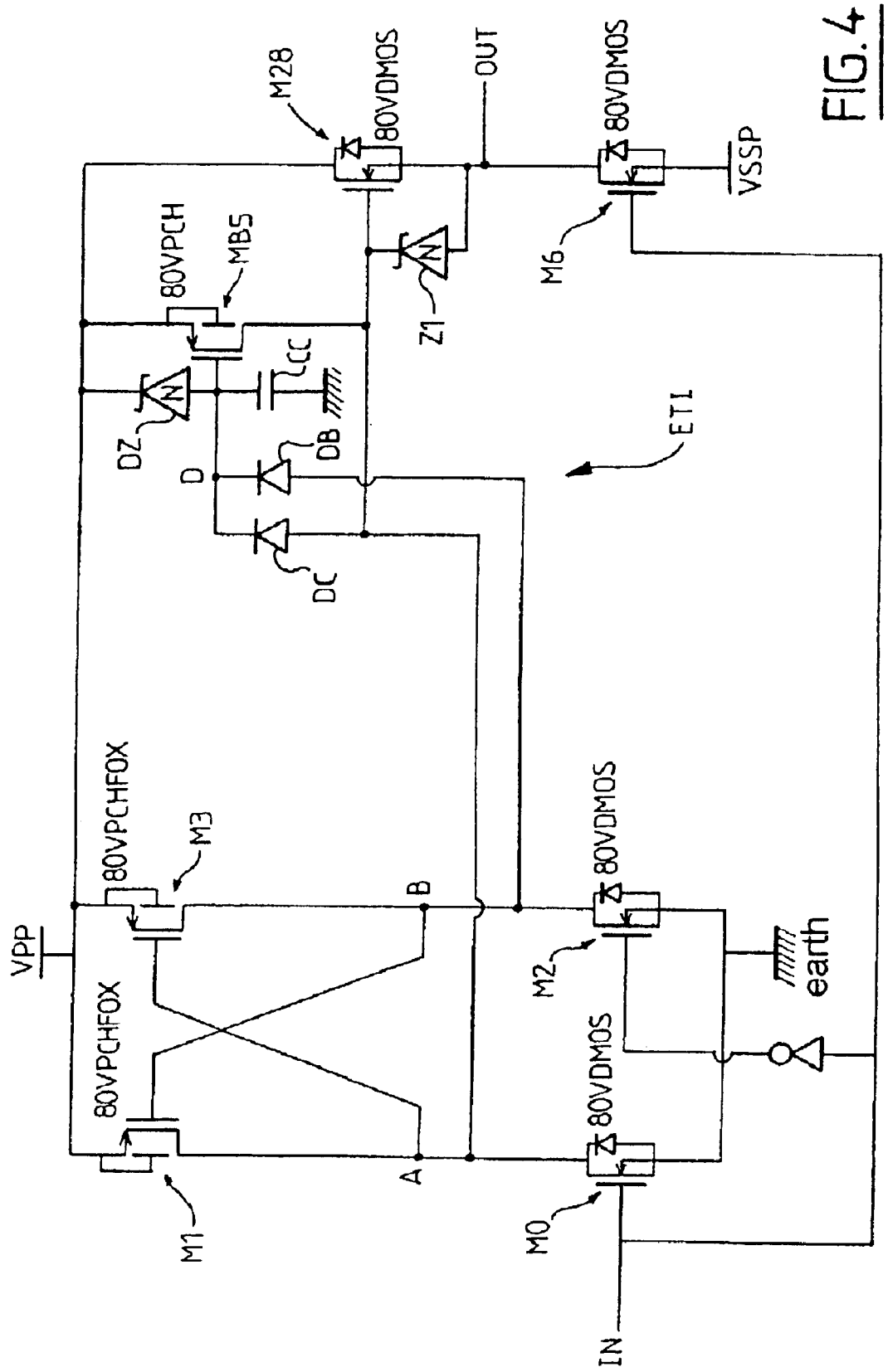
FIGS. 4 and 5 illustrate two other embodiments of a device according to the invention.

In the alternative embodiment illustrated in FIG. 4, the intermediate stage ETI comprises only the drive transistor MB5 together with the diodes DC and DB, the Zener diode DZ and the capacitor CC. This embodiment therefore has the advantage of requiring a smaller area of silicon for producing the integrated circuit incorporating the amplifier device according to the invention.

In this embodiment, the anode of the diode DC, the drain of the drive transistor MB5 and the gate of the output transistor M28 are connected to the node A of the level transposition stage. The anode of the diode DB is also connected to the node B of the level transposition stage.

The operation of this embodiment is similar to that described in the case of the embodiment shown in FIG. 1. This is because, assuming that the input voltage is in the low state in order to ensure a high logic level as output in AC mode, the drive transistor MB5 remains off until the supply voltage VPP has reached the threshold voltage of 1.5 V. However, when the supply voltage VPP reaches this threshold voltage, the transistor MB5 can start to conduct, is and the voltage at the node A can then increase. Until the supply voltage VPP has reached the value of 5 V, the voltage at the node D remains at earth/ground, while the gate/source voltage difference of the drive transistor MB5 increases. When the supply voltage VPP reaches 5 V, the node D continues to rise and follow the supply voltage VPP with a 5 V shift. The transistor MB5 then conducts with a gate/source voltage difference of 5 V. When the supply voltage VPP has reached its final value, the noted voltage remains at 5 V below the supply voltage. The diode DC also operates as a component for returning the node D to the high state, as explained above.

If the input voltage is in the high state in order to ensure a low logic level as output in AC mode, the operation is also equivalent to that described with reference to FIG. 2. In this case, the diode DB will at a given moment allow the drive transistor MB5 to be turned off, preventing any dissipation along the MB5, M0 path.

Figure 5:
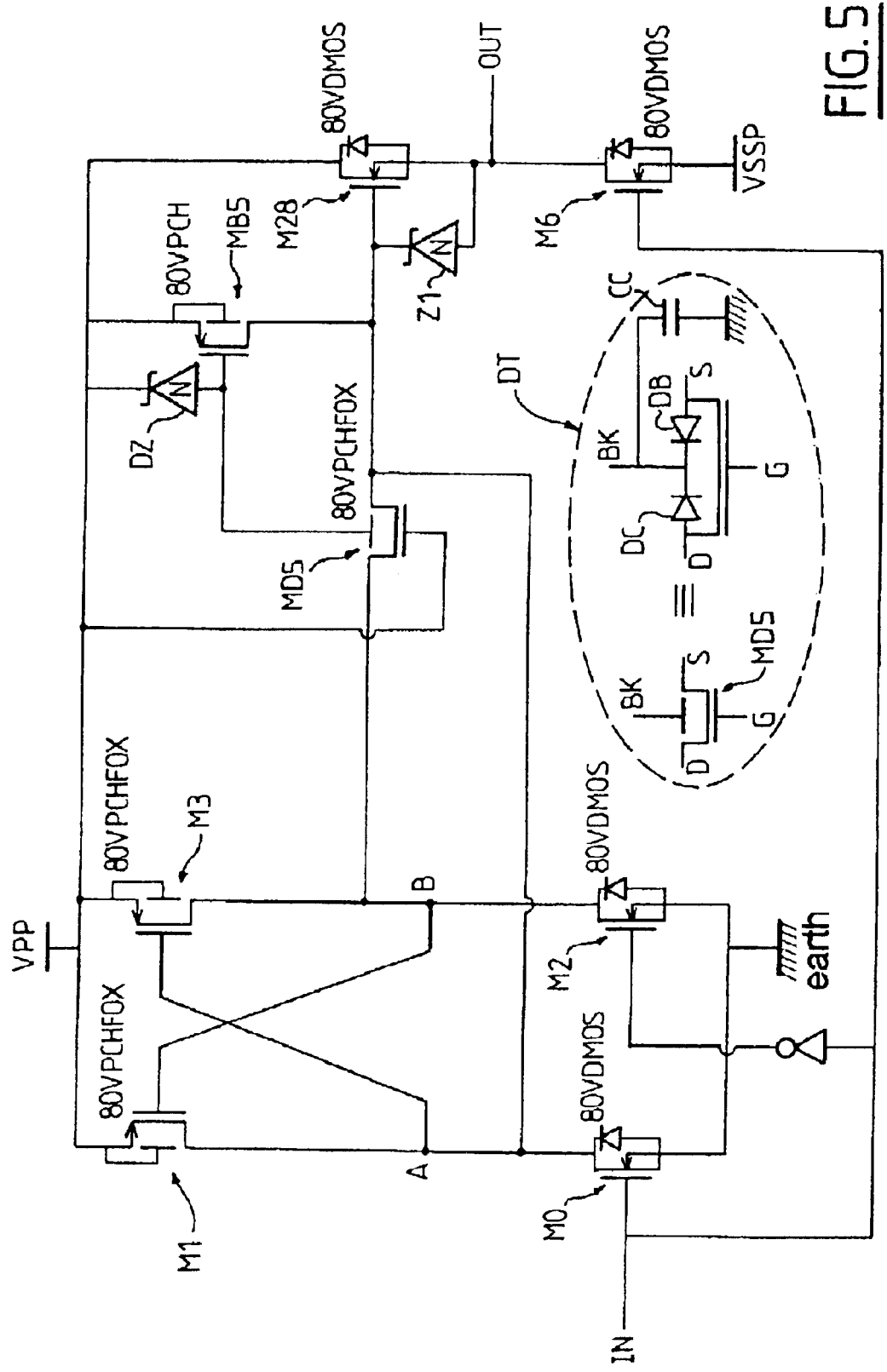

However, this embodiment may exhibit, in DC mode, simultaneous conduction in the transistors M0 and M1 during transitions in the output. Such simultaneous conduction may in some applications be troublesome if it introduces not insignificant dissipated power levels. Consequently, the embodiment shown in FIG. 4 may be preferably employed for devices that are only used in AC mode. Here again, in this embodiment, the diodes DC, DB and the capacitor CC may be produced by means of an additional thick-gate-oxide high-voltage transistor MD5, as illustrated in FIG. 5 and in a manner similar to that explained with reference to FIG. 3.

As used herein, the term "connected" is intended to encompass both a direct and an indirect electrical connection.

Although preferred embodiments of the method and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

What is claimed is:

1. A high-voltage inverter amplifier device, comprising:
    an input for receiving a low-voltage logic signal;
    an output for delivering a high-voltage logic signal;
    a level transposition stage connected to the input;
    an output stage comprising an output transistor connected between a high-voltage supply terminal and the output; and
    an intermediate stage intended to drive the output stage and connected between the supply terminal, the level transposition stage and a gate of the output transistor, wherein the intermediate stage comprises:
        a drive transistor of the thin-gate-oxide high-voltage MOS type connected between the supply terminal and the gate of the output transistor;
        at least one first diode, the cathode of which is connected to a gate of the drive transistor and the anode of which is connected to the level transposition stage; and
        control means connected to the gate of the drive transistor so as to make it conduct when an initially zero supply voltage at the supply terminal reaches the threshold voltage of the drive transistor.

2. The device according to claim 1 wherein the drive transistor is a p-channel transistor.

3. The device according to claim 1 wherein the control means comprises
    a Zener diode, the cathode of which is connected to the supply terminal and the anode of which is connected to the gate of the drive transistor; and
    a capacitor connected between the gate of the drive transistor and ground.

4. The device according to claim 3 wherein the capacitance of the capacitor is chosen so as to maintain the gate of the drive transistor at ground by means of a capacitive divider with the anode-cathode capacitance of the Zener diode and the transition capacitance of the diode or diodes.

5. The device according to claim 1, wherein the intermediate stage includes a second diode, the cathode of which is connected to the gate of the drive transistor and the anode of which is connected to the gate of the output transistor.

6. The device according to claim 5, wherein the intermediate stage includes an additional transistor connected between the gate of the output transistor and the level transposition stage, a substrate of which is connected to the gate of the drive transistor, and the additional transistor being controlled on its gate so as to be always off, the additional transistor forming the capacitance of the control means and the first and second diodes.

7. The device according to claim 6, wherein the additional transistor is a thick-gate-oxide high-voltage MOS transistor.

8. The device according to claim 6 wherein the additional transistor is a p-channel transistor having its gate connected to the high-voltage supply terminal.

9. The device according to claim 6, wherein the intermediate stage also includes a pair of complementary intermediate transistors, a p-channel one of intermediate transistors having its source connected to the supply terminal, its drain connected to the gate of the output transistor and also to a drain of the drive transistor, and its gate connected to the level transposition stage.

10. The device according to claim 9 wherein a source of the additional transistor is also connected to the drain of the p-channel intermediate transistor.

11. The device according to claim 9 wherein the p-channel intermediate transistor is a thick-gate-oxide high-voltage MOS transistor.

12. The device according to claim 1, wherein the intermediate stage further comprises:
    a pair of complementary intermediate transistors, a p-channel one of the intermediate transistors having its source connected to the supply terminal, its drain connected to the gate of the output transistor and also to the drain of the drive transistor, and its gate connected to the level transposition stage.

13. The device according to claim 1, wherein the device is produced in the form of an integrated circuit.

14. The device according to claim 1, wherein the device is an amplifier for a plasma display panel.

15. A high-voltage inverter amplifier device, comprising:
    an input for receiving a low-voltage logic signal;
    an output for delivering a high-voltage logic signal;
    a level transposition stage connected to the input;
    an output stage comprising an output transistor connected between a high-voltage supply terminal and the output; and
    an intermediate stage connected between the level transposition stage and the output stage, the intermediate stage including a high voltage drive transistor having a low threshold voltage, the drive transistor being connected between the supply terminal and the gate of the output transistor;
    a diode connected between the level transposition stage and a gate of the drive transistor;
    wherein the drive transistor begins conducting when a voltage applied to the supply terminal exceeds the low threshold voltage, the conducting drive transistor causing an increase in voltage at the gate of the output transistor which causes the output transistor to conduct.

16. The device of claim 15 wherein the intermediate stage further includes an intermediate transistor connected between the supply terminal and the gate of the output transistor, the intermediate transistor having a threshold voltage which substantially exceeds the low threshold voltage of the drive transistor.

17. The device of claim 16 wherein the low threshold voltage of the drive transistor is about 1.5V and the threshold of the intermediate transistor is about 10V.

18. The device of claim 15 wherein the low threshold voltage of the drive transistor is about 1.5V.

19. The device of claim 15 wherein the intermediate stage further includes a control circuit operable to allow the drive transistor to conduct when the supply voltage exceeds the low threshold voltage.

20. A high-voltage inverter amplifier device, comprising:
an input for receiving a low-voltage logic signal;
an output for delivering a high-voltage logic signal;
a level transposition stage connected to the input;
an output stage comprising an output transistor connected between a high-voltage supply terminal and the output; and
an intermediate stage connected between the level transposition stage and the output stage, the intermediate stage including a drive transistor having a low threshold voltage, the drive transistor being connected between the supply terminal and the gate of the output transistor;
wherein the drive transistor begins conducting when a voltage applied to the supply terminal exceeds the low threshold voltage, the conducting drive transistor causing an increase in voltage at the gate of the output transistor which causes the output transistor to conduct;
wherein the intermediate stage further includes a control circuit operable to allow the drive transistor to conduct when the supply voltage exceeds the low threshold voltage; and
wherein the control circuit comprises:
a Zener diode connected between the supply voltage and the gate of the drive transistor; and
a capacitor connected between the gate of the drive transistor and ground.

21. The device of claim 19:
wherein the control circuit is further operable to stop the drive transistor from conducting when the supply voltage exceeds a threshold voltage which substantially exceeds the low threshold voltage.

22. The device of claim 20 wherein the control circuit comprises a diode connected between the gate of the drive transistor and the gate of the output transistor.

23. The device of claim 22 wherein the diode and capacitor of the control circuit are implemented using a transistor.

24. A high-voltage inverter amplifier device, comprising:
an input for receiving a low-voltage logic signal;
an output for delivering a high-voltage logic signal;
a level transposition stage connected to the input;
an output stage comprising an output transistor connected between a high-voltage supply terminal and the output;
an intermediate stage connected between the level transposition stage and the output stage, the intermediate stage including a drive transistor having a low threshold voltage, the drive transistor being connected between the supply terminal and the gate of the output transistor; and
a first diode connected between the gate of the drive transistor and an output of the level transposition stage;
wherein the drive transistor begins conducting when a voltage applied to the supply terminal exceeds the low threshold voltage, the conducting drive transistor causing an increase in voltage at the gate of the output transistor which causes the output transistor to conduct.

25. The device of claim 24 wherein the first diode and a capacitor connected between the gate of the drive transistor and ground are implemented using a transistor.

26. A high-voltage inverter amplifier device, comprising:
an input for receiving a low-voltage logic signal;
an output for delivering a high-voltage logic signal;
a level transposition stage connected to the input;
an output stage comprising an output transistor connected between a high-voltage supply terminal and the output; and
an intermediate stage connected between the level transposition stage and the output stage, the intermediate stage including a drive transistor having a low threshold voltage, the drive transistor being connected between the supply terminal and the gate of the output transistor;
wherein the drive transistor begins conducting when a voltage applied to the supply terminal exceeds the low threshold voltage, the conducting drive transistor causing an increase in voltage at the gate of the output transistor which causes the output transistor to conduct; and
wherein the level transposition stage includes a first and second output connected to the drive transistor of the intermediate stage.

27. The device of claim 26 wherein the low threshold voltage of the drive transistor is about 1.5V.

28. The device of claim 26 wherein the intermediate stage further includes a control circuit operable to allow the drive transistor to conduct when the supply voltage exceeds the low threshold voltage.

29. The device of claim 28 wherein the control circuit comprises:
a Zener diode connected between the supply voltage and the gate of the drive transistor; and
a capacitor connected between the gate of the drive transistor and ground.

30. The device of claim 28 wherein the control circuit is further operable to stop the drive transistor from conducting when the supply voltage exceeds a threshold voltage which substantially exceeds the low threshold voltage.

31. The device of claim 29 wherein the control circuit comprises a first diode connected between the gate of the drive transistor and the gate of the output transistor, wherein the gate of the output transistor is connected to the first output of the level transposition stage.

32. The device of claim 31 wherein the first diode and capacitor of the control circuit are implemented using a transistor.

33. The device of claim 29 further including a second diode connected between the gate of the drive transistor and the second output of the level transposition stage.

34. The device of claim 33 wherein the first diode, second diode and capacitor of the control circuit are implemented using a transistor.

35. The device according to claim 15, wherein the device is produced in the form of an integrated circuit.

36. The device according to claim 15, wherein the device is an amplifier for a plasma display panel.

* * * * *